United States Patent [19]
Doddrell et al.

[11] Patent Number: 5,121,060
[45] Date of Patent: Jun. 9, 1992

[54] MAGNETIC FIELD HOMOGENIZATION IN NMR SPECTROSCOPY

[75] Inventors: David M. Doddrell, Westlake; Graham J. Galloway, Runcorn; Ian M. Brereton, Auchenflower, all of Australia

[73] Assignee: University of Queensland, St. Lucia, Australia

[21] Appl. No.: 477,942
[22] PCT Filed: Nov. 4, 1988
[86] PCT No.: PCT/AU88/00429
§ 371 Date: Jun. 15, 1990
§ 102(e) Date: Jun. 15, 1990
[87] PCT Pub. No.: WO89/04478
PCT Pub. Date: May 18, 1989

[30] Foreign Application Priority Data

Nov. 5, 1987 [AU] Australia ................ PI5263

[51] Int. Cl.⁵ .......................................... G01R 33/20
[52] U.S. Cl. ........................... 324/320; 324/318
[58] Field of Search ............ 324/320, 318, 319, 322, 324/309

[56] References Cited

U.S. PATENT DOCUMENTS

| 4,528,510 | 7/1985 | Loeffler et al. | 324/309 |
|---|---|---|---|
| 4,585,992 | 4/1986 | Maudsley et al. | 324/309 |
| 4,623,844 | 11/1986 | Macovski | 324/320 |
| 4,647,858 | 3/1987 | Bottomley | 324/320 |
| 4,680,551 | 7/1987 | O'Donnell et al. | 324/320 |
| 4,700,136 | 10/1987 | Yamaguchi et al. | 324/309 |
| 4,703,275 | 10/1987 | Holland | 324/318 |
| 4,740,753 | 4/1988 | Glover et al. | 324/320 |
| 4,749,948 | 7/1988 | Duby et al. | 324/320 |
| 4,761,612 | 8/1988 | Holland | 324/318 |
| 4,857,843 | 8/1989 | Macovski | 324/307 |
| 4,899,109 | 2/1990 | Tropp et al. | 324/320 |

FOREIGN PATENT DOCUMENTS 2155642 3/1985 United Kingdom .

OTHER PUBLICATIONS

Journal of Magnetic Resonance, vol. 73, No. 1, Jun. 1, 1987, pp. 174–177 "Shimming" on spatially localized signals, from D. I. Hoult.

Magnetic Resonance in Medicine, vol. 7, No. 3, Jul. 3, 1988, pp. 352–357 "Nodal Inhomogeneity Mapping by Localized Excitation-The Nimble"-Shimming Technique for High-Resolution in Vivo NMR Spectroscoy from David M. Doddrell, Graham J. Galloway, Ian M. Brereton, and William M. Brooks.

Primary Examiner—Michael J. Tokar
Attorney, Agent, or Firm—Rosenblum, Parish & Isaacs

[57] ABSTRACT

A method for providing B₀ homogeneity at voxels away from the magnet isocenter for use in volume selected NMR spectroscopy wherein voxels are shimmed using only first-order X, Y and Z shims to produce three dimensional shim current maps that are utilized in setting up for in vivo spectroscopy.

10 Claims, 3 Drawing Sheets

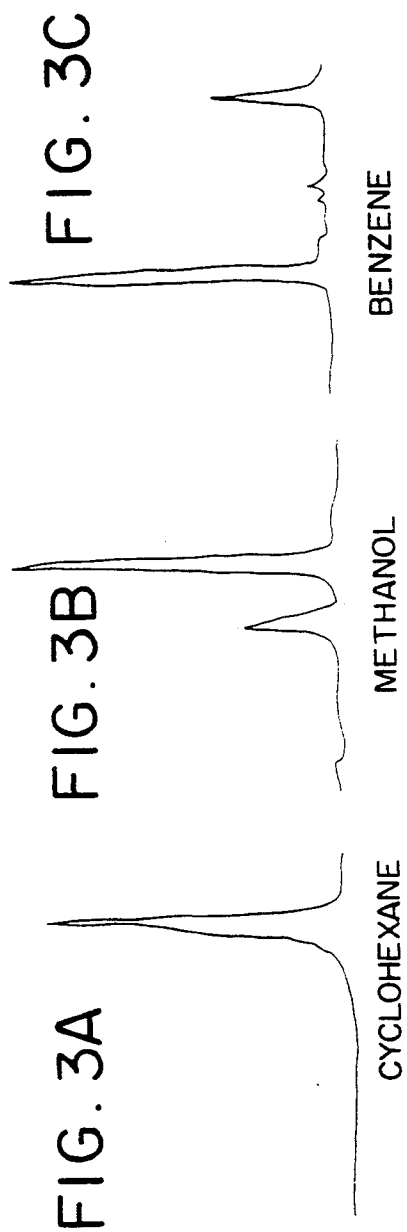
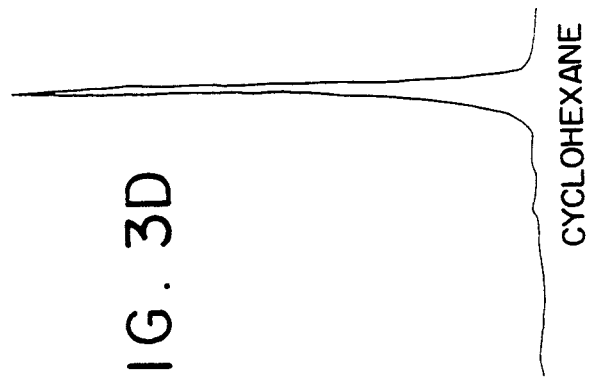

WHOLE LEG $^1$H SPECTRUM

SHIMMING-TIBIA

SPACE VOLUME SELECTION

MAGNETIC FIELD HOMOGENIZATION IN NMR SPECTROSCOPY

FIELD OF THE INVENTION

This invention relates to NMR spectroscopy and in particular to a method whereby the $B_o$ magnetic field may be made homogeneous.

BACKGROUND OF THE INVENTION

High resolution NMR spectroscopy requires a $B_o$ magnetic field variation across the volume being observed of less than 1 part in $10^7$. As the sample itself will introduce perturbation to the field, this degree of homogeneity is normally achieved by adjustment of the $B_o$ field with each sample. This process is known as "shimming" and involves adjusting the currents in as many as 18 electromagnets, each of which has a very specific contour. In volume-selected NMR spectroscopy it is normal practice to shim the whole volume using a simple pulse and acquire sequence before attempting to perform the volume selected experiment. As this procedure is an iterative process, it can be very time consuming. In the traditional high-resolution experiment the homogeneity adjustments are made using the response from the whole sample which is carefully positioned about the magnet isocenter. By comparison, for in vivo spectroscopy, the whole sample is large whereas the volume of interest is relatively small and not in general positioned at the magnet isocenter. The adjustment of the magnetic field homogeneity may now be difficult. It is only at the magnet isocenter that shim sets are not strongly coupled. This is clearly a serious consideration when high-resolution spectra are required from sites remote from the isocenter.

The major goal of magnetic resonance spectroscopy (MRS) is to obtain a high-resolution spectrum from a known position. This task appears to be best achieved using image-directed spectroscopy whereby one of a variety of gradient-encoded volume-selection techniques is implemented using excitation frequencies determined from a proton density image of the object. With the notable exception of the VOSY method referred to herein, no volume-selection technique achieves spatial selection in one acquisition and, in general, eight acquisitions are required to complete the volume-selection procedure. This add-substract cycle often places severe demands upon the preamplififer and ADC. In the present inventor's experience, however, the major experimental difficulty relates to the adjustment of the shim set for high-resolution acquisition from the voxel of interest.

Since, over small distances, the inhomogeneities approximate to a straight line, only the three first-order shim gradients (X, Y, Z) need be used to correct the homogeneity of the $B_o$ field. In addition, the spectral response from spins outside the voxel of interest may be severely broadened by the shimming procedure, thus reducing the dynamic range requirements of the preamplifier and ADC.

For this concept to be exploited it is essential that the volume selection technique which is used performs complete suppression of signals arising from outside the volume of interest in a single acquisition. Thus, in medium-bore and whole-body magnets, it should be possible to achieve high-resolution shimming on a small voxel using only the X, Y and Z shims.

OBJECT OF THE INVENTION

It is an object of this invention to use such a technique to determine the current required in each of the X, Y and Z shims to achieve the required $B_o$ homogeneity for each small volume element within the useable volume of the magnet. In this way the required shim currents can be predetermined and recorded. They can be mapped as a function of spatial position, described using cartesion co-ordinates x, y and z. It should be noted that such maps will be different for each magnet and may be difficult to predict. The maps will also be modified by each radiofrequency (r.f.) probe which is used. Once mapped for a particular probe configuration, the currents are only minimally affected by different samples. By use of the predetermined shim currents, the apparatus may be more readily set up in preparation to study a test subject.

Other objects, and various advantages, will hereinafter become apparent.

OUTLINE OF THE INVENTION

The invention provides a method for operation of a nuclear magnetic resonance apparatus wherein a measurement is performed on a specimen in a selected unit volume after first optimising the $B_o$ field in that unit volume characterised in that:

for a particular combination of magnet and probe, those X, Y and Z shimming currents that optimise the $B_o$ field in the absence of the specimen in a plurality of unit volumes throughout the working volume are first determined and in the measurement with the specimen in place the predetermined X, Y and Z shimming currents for the unit volume of interest are first applied to provide a detectable signal that is then optimised by further shimming prior to the measurements performance in that unit volume.

As stated above, whilst the magnet field established in the working volume of an NMR apparatus by its surrounding magnet usually needs to be homogeneous throughout the working volume, the introduction of radiofrequency probes and samples is likely to disturb that homogeneity. To accommodate the probes and samples in the working volume and re-establish homogeneity in its magnet field, a set of electromagnet shims are provided which are independently and controllably powered according to predetermined regimes. In the present invention, so as to maximise the signal output when investigating a test subject, the following multi-step operational procedure is adopted.

As a first step, the working volume is filled out with a homogeneous test body such as water. With a suitable probe in place a resonance signal is optimised in each unit volume that may be addressed by the probe by independent adjustment of the electromagnet shims and the requisite currents required to establish the desired field in that unit volume are recorded. Thus, whilst the field across the working volume may not be made uniform at any particular time, the field at a particular unit volume may be set at a desired uniform strength whilst an experiment is conducted in that volume. By continuous adjustment, the experiment may be performed stepwise in each unit volume across the working volume of the magnet.

The introduction of a test subject will further perturb the field of the magnet and the next step in the process is designed to return that field to an optimum character.

Whilst a test subject will perturb the otherwise uniform field, it is possible to detect a proton resonance in a volume of interest within a biological specimen by application of those currents in the electromagnet shims which were previously determined to produce an otherwise uniform field with the probe being used in the experiment. By further tuning of the currents, the detected signal may be optimised to indicate what currents are to be maintained for an actual experiment.

Having determined the best current levels, an NMR spectrum of the specimen in the volume of interest may be produced. By repetition of the above steps, it is possible to scan a specimen and determine spectra that are characteristic of each of the accessible unit volumes therein.

OUTLINE OF THE DRAWINGS

The invention will now be described having regard to preferred embodiments with reference to the drawings in which:

FIGS. 3A, 3B, 3C, 3D, 3E and 3F are volume selected $^1$H spectra obtained using the invention; (FIG. 4A was obtained by standard techniques—FIG. 4B follows shimming using the invention—FIG. 4C is the volume selected spectrum.)

PREFERRED EMBODIMENT

Basic implementation of this invention is as follows:

(1) For each r.f. probe system the X, Y and Z shim currents are determined using a large homogeneous sample of water and a pulse sequence which gives complete volume selection in a single acquisition. This is repeated at different positions within the magnet. The number of points will depend on the desired resolution and the size of the useable volume of the magnet.

(2) A magnetic resonance image of the sample of interest, either a phantom or a biological specimen is obtained, and the spatial co-ordinates of the volume of interest determined.

(3) The maps obtained in step (1) are interpolated to obtain predicted currents for the X, Y and Z shims to give optimum shimming at the co-ordinates of interest.

(4) These currents should give sufficient $B_o$ homogeneity to obtain a signal from the volume of interest. This signal is now optimised by fine adjustment of the X, Y and Z shim currents while observing the signal using the same technique as was used in step (1).

(5) The final high-resolution spectrum can be obtained using one of a number of gradient-encoded volume selection techniques. At this stage it is possible to incorporate water-suppression methods or to observe nuclei other than $^1$H.

The following points can be significant in the implementation of the invention.

When Bo field gradients are used in a magnetic resonance experiment it is usually necessary to compensate for eddy currents induced by the rapidly changing magnetic field. This is achieved by preconditioning the current passing into the gradient coils, a procedure referred to as gradient pre-emphasis.

The gradient pre-emphasis cannot be altered between performing the mapping experiment in step (1) and the final volume selected experiment used in step (5) of implementation. Such variation changes the effective homogeneity during the acquisition of the final signal. It is necessary to use similar timing of gradient rise and fall for both the mapping experiment and the final experiment.

In the following is described a specific implementation that may be used to verify the intergrity of this invention.

(B1) Step 1 of the basic invention was performed using a modification of the VOSY method of volume selection (*Volume-selective multipulse spinecho spectroscopy*, R. Kimmich and D. Hoepfel, J. Magn. Reson. 72, 379–384 (1987) ).

Figure 1:
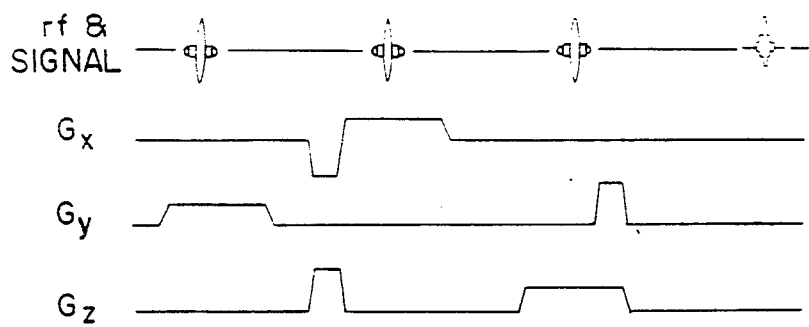
FIG. 1 shows the pulse sequence used for volume selection.

FIG. 1 shows the pulse sequence used.

Figure 2:
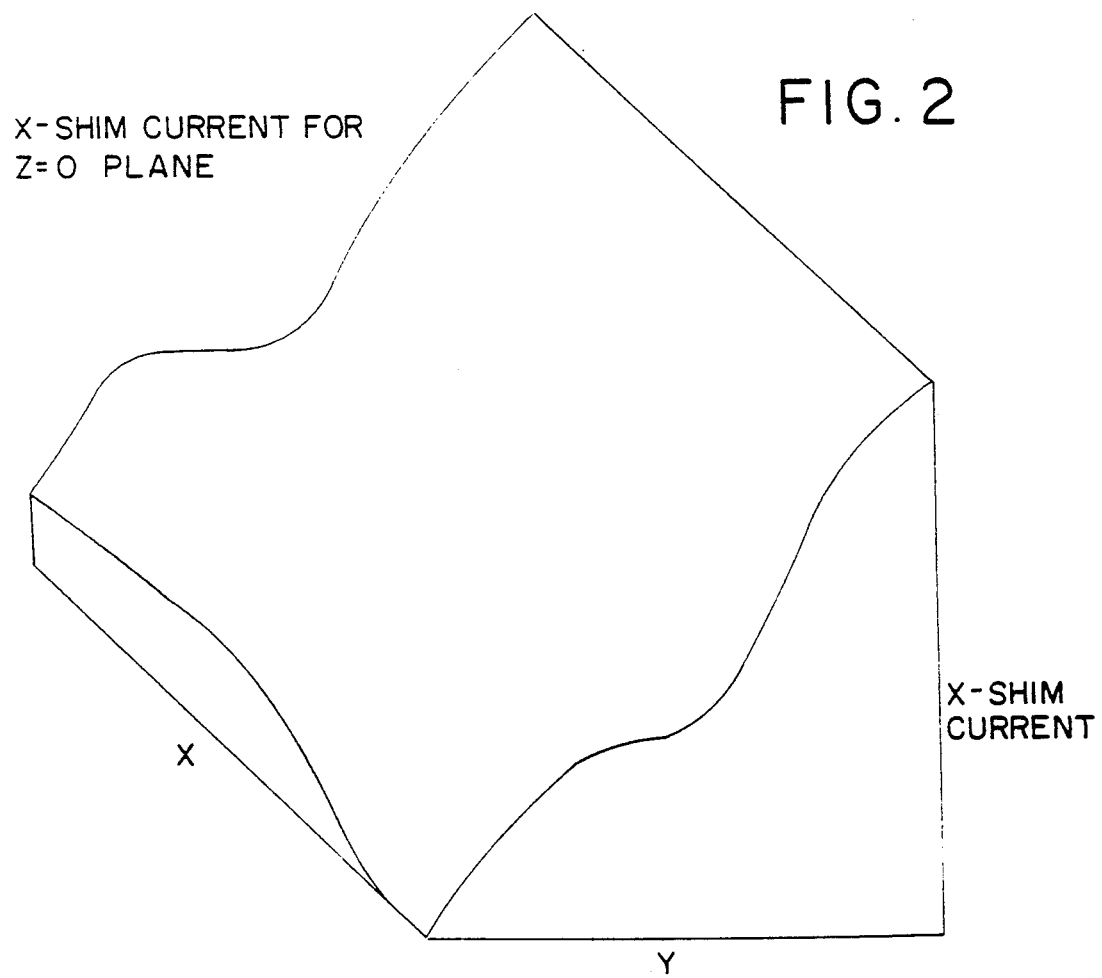
FIG. 2 shows a typical plot of shim currents.

FIG. 2 shows the shimming maps for the X shim current as the selected volume is moved in the x and y directions for a fixed plane in the z-direction. Similar maps were produced for the Y and Z shim currents.

(B2) The $^1$H image was obtained using a standard spinwarp imaging technique.

(B3) The interpolation of the shimming maps was performed by visual scrutiny of line plots.

(B4) Fine adjustment of the shims was performed using the same experiment as described in step (B1).

(B5) The final spectrum was obtained using the SPACE volume selection technique (*Spatial and chemical-shift-encoded excitation, SPACE, a new technique for volume-selected NMR spectroscopy*, D. M. Doddrell, W. M. Brooks, J. M. Bulsing, J. Field, M. G. Irving and H. Baddeley, J. Magn. Reson. 68, 367–372 (1986) ).

The variation of VOSY was chosen because it allows similar timing to be used for the gradients required for the SPACE experiment. This enabled the same gradient pre-emphasis to be used for both experiments. The pre-emphasis was adjusted to give the best possible result in the final SPACE experiment. Any compromise that this introduced to the VOSY experiment was well within the tolerance limits of the experiment.

Referring now to FIG. 2, the invention was tested using a phantom which consisted of a 9 cm cylinder filled with water, into which is placed three 2 cm diameter bottles filled with benzene, methanol and cyclohexane.

FIG. 3 shows the volume-selected $^1$H spectra obtained from each of the three small bottles. In each case, a 1 cm cube was selected using SPACE. The homogeneity of the voxel had been optimised using the invention. FIGS. 3A, 3B and 3C show the spectra obtained using the X, Y and Z shim currents predicted by interpolation of the shim maps, while FIGS. 3D, 3E and 3F show the spectra obtained after fine adjustment of the shims for the voxel of interest.

Figure 4A:
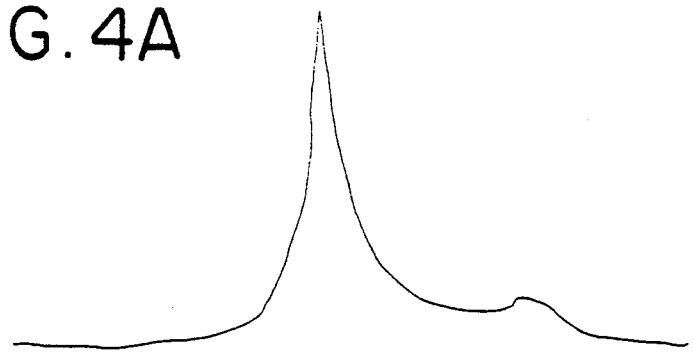
FIGS. 4A, 4B and 4C are $^1$H spectra of the marrow of a human leg.
Figure 4B:
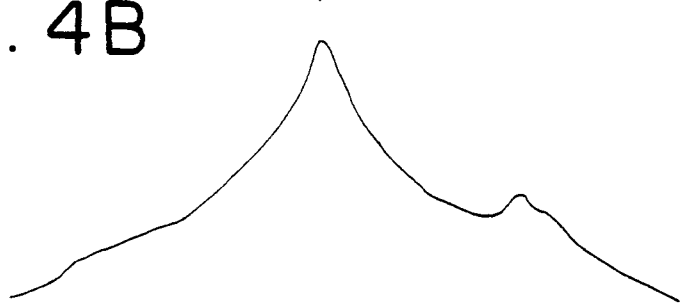
Figure 4C:
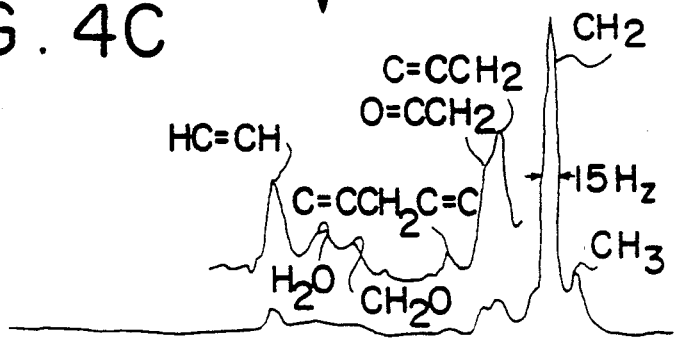

The invention was also tested in vivo. FIG. 4A is the $^1$H spectrum of a human leg following a standard shimming procedure. FIG. 4B shows the spectrum of the whole leg following shimming with the procedure of the invention in order to optimise the $B_o$ field homogeneity for a voxel within the marrow of the tibia. FIG. 4C shows the volume-selected $^1$H spectrum obtained for a 1 cm cube of bone marrow in the tibia of a human subject.

In applying this technique, the following steps were implemented. The sample, the human leg, was placed into the previously mapped magnet. A spin-echo image (transverse slice) was then recorded, to provide the excitation frequencies for localized spectroscopy. The predicted shim settings, X, Y and Z, for the spatial position of interest were then set and the VOSY pulse sequence was used to make the final homogeneity adjustment. Once the optimum homogeneity was obtained, a more sensitive pulse sequence (such as SPACE or ISIS) was used to obtain the final high-resolution spectrum. Without the initial shim settings from the shim maps, it is a time-consuming task to adjust the homogeneity of the magnetic field. Using the present procedure for a few minutes is all that is usually required. For the in vivo spectra shown, the whole procedure required less than 45 min.

Data were collected at 100 MHz using a BRUKER MSL-100 spectrometer interfaced to a 2.35T, 40 cm horizontal bore magnet. Approximately 6 kW of radiofrequency power was available to provide short pulse times.

As a further development from the above, the shimming maps could be stored in a digital computer. The surfaces might be generated mathematically to aid in the prediction of optimum starting values for any particular co-ordinate. By this means the surfaces that are characteristic of a chosen probe may be stored for a large number of Z-planes. For points which are not located on one of the stored Z-planes, it would be possible to allow interpolation between the surfaces of the bounding stored Z-planes that are chosen in the original mapping procedure so as to arrive at an appropriate value.

It would be possible to store separate sets of maps for different anatomical situations (e.g. head, abdomen, calf) for particular probes and magnet combinations such that as a new subject is investigated, the new shim values that are determined by the above method could be incorporated into the data set and the surfaces proposed in first stage of the basic process above might be updated so as to increase their effectiveness in allowing a fast set up time.

By using the predetermined shim maps it is straightforward to move the homogeneous voxel (as small as 1 cm$^3$) within the spectroscopic homogeneous volume of the magnet. If the higher-order shims are set to zero, the volume in our magnet over which localized shimming can be implemented by using only the X, Y, and Z shims is $6 \times 6 \times 11$ cm$^3$. If the whole magnet is shimmed on a large sample using all shims prior to implementing the procedure, the volume over which localized shimming can be performed is increased to $8 \times 8 \times 13$ cm$^3$. On average, the achievable linewidths from a 1 cm$^3$ voxel within this volume are a factor of 2 sharper than those when the higher-order shims are not used. Also, the signal-to-noise for imaging is much improved if all shims are utilized.

The technique developed herein provides spectroscopists with a movable homogeneous volume. However, it would be most difficult to perform multivolume acquisitions unless the X, Y, Z shim current settings were varied for each volume during the acquisition cycle. Automatic computer-controlled shimming operations shim the entire homogeneous volume of the magnet about its isocenter, the point at which the shim set is orthogonal. This does not guarantee optimum homogeneity for voxels off the isocenter. Indeed, signals from such voxels may be too broad to be observed when volume selected following standard shimming.

Whilst the above has been described with reference to a preferred embodiment, it will be clear that many variations might be made thereto that are within the scope and spirit of the invention as hereinbefore set forth.

We claim:

1. A method for performing nuclear magnetic resonance measurements on a nuclear magnetic resonance apparatus having:

a magnet generating a constant magnetic field ($B_0$) within a sample area having predetermined unit volumes along a spatial coordinate system;

shimming means superimposing correction magnetic field components along predetermined gradients (X, Y, Z) on said magnetic field ($B_0$) for obtaining a resultant magnetic field of improved homogeneity;

high-frequency means for exciting nuclear magnetic resonances within predetermined unit volumes of a sample placed within said sample area;

measuring means for receiving and processing nuclear magnetic resonance signals from said sample, generated in a predetermined unit volume thereof;

control means for setting electrical currents within said shimming means depending on said nuclear magnetic resonance signals, said control means comprising a memory for storing electrical current values;

the method comprising the steps of:

placing a reference sample into said sample area;

exciting nuclear magnetic resonance within a first unit volume of said reference sample;

measuring and processing a nuclear magnetic resonance signal received from said first unit volume;

setting said electrical currents until a first electrical current value is set resulting in said nuclear magnetic resonance signal of said first unit volume showing highest homogeneity;

storing said first electrical current value within said memory;

repeating said exciting, measuring, setting and storing steps in subsequent predetermined unit volumes for obtaining an electrical current value vs. unit volume mapping;

removing said reference sample from said sample area;

placing a sample under investigation into said sample area;

determining a specific unit volume of interest within said sample under investigation;

setting said electrical currents according to said mapping for said specific unit volume of interest;

exciting and measuring nuclear magnetic resonance within said specific unit volume of interest of said sample under investigation;

adjusting said electrical currents during the preceding step of exciting and measuring for further improving homogeneity within said specific unit volume of interest; and recording a nuclear magnetic resonance signal from said specific unit volume of interest with said improved homogeneity.

2. The method of claim 1 wherein said reference sample consists of water.

3. The method of claim 1 wherein said nuclear magnetic resonance signals are generated by using a high-frequency pulse sequence and pulsed magnetic field gradients for exciting nuclear magnetic resonance only in one specific unit volume.

4. The method of claim 1 wherein after said step of placing said sample under investigation into said sample area, a nuclear magnetic resonance imaging measurement is performed on said sample under investigation for generating an image thereof, said specific unit volumes of interest being thereafter selected from said image.

5. The method of claim 1 wherein eddy currents are compensated for with a gradient pre-emphasis preconditioning said electrical currents of said shimming means and the same pre-emphasis is maintained throughout said further steps up to said step of recording a nuclear magnetic resonance signal from said specific unit volume of interest with said improved homogeneity.

6. The method of claim 1 wherein during said step of adjusting said electrical currents, adjusted current values corresponding to said further improved homogeneity are stored for being set during succeeding measurements on similar samples under investigation.

7. The method of claim 1 wherein said step of obtaining an electrical current value vs. unit volume mapping comprises the step of mapping electrical current values for unit volumes arranged within a common plane of said spatial coordinate system.

8. The method of claim 7 wherein said unit volumes within said common plane are distant from each other and electrical current values for intermediate unit volumes therebetween are obtained by interpolation of electrical current values of neighboring distant unit volumes.

9. The method of claim 1 wherein said first and subsequent unit volumes as well as said specific unit volumes of interest are away from an isocenter of said magnet.

10. The method of claim 1 wherein said electrical currents are set within first-order X, Y and Z shimming means.

* * * * *